(12) United States Patent
Colin et al.

(10) Patent No.: US 6,838,658 B2
(45) Date of Patent: Jan. 4, 2005

(54) SIMPLE AND COMPACT LASER WAVELENGTH LOCKER

(75) Inventors: Sylvain M. Colin, Milpitas, CA (US); Raghuram Narayan, Fremont, CA (US); Owen B. Pine, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 10/293,140

(22) Filed: Nov. 12, 2002

(65) Prior Publication Data

US 2004/0089794 A1 May 13, 2004

(51) Int. Cl.[7] ................................................. G01J 3/50
(52) U.S. Cl. ......................................... 250/226; 372/32
(58) Field of Search ................................. 250/226, 216; 372/31, 32, 29.02

(56) References Cited

U.S. PATENT DOCUMENTS

| | | | |
|---|---|---|---|
| 5,825,792 A | 10/1998 | Villeneuve et al. | |
| 5,963,686 A | 10/1999 | Zheng et al. | |
| 6,122,301 A | 9/2000 | Tei et al. | |
| 6,477,190 B1 * | 11/2002 | Komiyama et al. | ........... 372/34 |

* cited by examiner

Primary Examiner—Thanh X. Luu
(74) Attorney, Agent, or Firm—Kevin A. Reif

(57) ABSTRACT

A wavelength locker for monitoring the wavelength drift of a laser uses a pair of detectors for detecting a power component of the laser beam and a wavelength component of the laser beam, respectively. Various positionings of the power detector and/or variations to the collimating lens provide a compact arrangement with fewer components.

10 Claims, 9 Drawing Sheets

SIMPLE AND COMPACT LASER WAVELENGTH LOCKER

FIELD OF THE INVENTION

Embodiments of the present invention are directed to wavelength lockers and, more particularly, embodiments of the present invention are directed to more compact wavelength lockers conserving valuable package space.

BACKGROUND INFORMATION

Wavelength division multiplexing (WDM) is a technique used to transmit multiple channels of data simultaneously over the same optic fiber. At a transmitter end, different data channels are modulated using light having different wavelengths or, colors for each channel. The fiber can simultaneously carry multiple channels in this manner. At a receiving end, these channels are easily separated prior to demodulation using appropriate wavelength filtering techniques.

The need to transmit greater amounts of data over a fiber has led to so-called Dense Wavelength Division Multiplexing (DWDM). DWDM involves packing additional channels into a given bandwidth space. The resultant narrower spacing between adjacent channels carried by a fiber in DWDM systems demands precision wavelength accuracy from the transmitting laser diodes.

Unfortunately, as laser diodes age, they are known to exhibit a wavelength drift of up to 0.15 nm from their set frequency over about a fifteen year period. This period is well within the expected service life of modern laser diodes. Hence, this wavelength drift is unacceptable as a given channel may drift and interfere with adjacent channels causing cross talk. To remedy this situation most laser transmitters use what is commonly referred to in the art as a wavelength locker to measure drift frequency vs. set frequency. This information can be fed back to a controller to adjust various parameters, such as temperature or drive current, of the laser diode to compensate for the effects of aging and keep the diode laser operating at its set frequency. Most laser transmitters with an integrated wavelength locker use either an etalon or thin film filter to measure the laser wavelength variation.

FIGS. 1A and 1B show a type of conventional wavelength locker configuration. A laser 6 produces a laser beam centered about a set frequency or wavelength. The laser 6 emits a light beam from both a front facet 15 and a back facet 13. The actual modulated light carrying the data channel emerges from the front facet 16, which is coupled to an optical fiber (not shown). The beam 12 that emerges from the back facet 13 is used for monitoring purposes since it has the same wavelength as the beam emerging from the front facet 15. The monitored beam 12 passes through a lens 8. A beam splitter 10 splits a monitored beam 12 into two beams. The first beam 14 passes through the splitter 10 and is received by a first detector 16, hereinafter referred to as the power monitor detector 16. The second beam 20 is deflected and passes through a wavelength filter (etalon) 22 after which it is received by a second detector 24, hereinafter referred to as the filter detector 24.

In operation, the detectors 16 and 24, which may be for example, photodiode or optoelectrical detectors, output an electric signal based on the optical input of the received beam. The first detector 16 receives the first beam 14 and outputs a signal that is a function of the monitored beam's 12 power. The second detector 24 receives the second beam 20 and outputs a signal that is a function of both the monitored beam's 12 power as well as its wavelength. Thus, by mathematically operating on these signals as output by the detectors, 16 and 24, the wavelength of the monitored laser beam 12 can be determined and compared to the set frequency to determine any wavelength drift of the laser's 6 output.

The above configuration includes a beam splitter 10 as well as a filter 22 and second detector 24, positioned perpendicular to the optical axis of the monitored beam 12. Thus, this arrangement takes up an undesirably large amount of space in an optical device package.

FIG. 2 shows an alternate wavelength locker configuration that uses a "stacked" arrangement of detectors. As shown, the filter detector 26 and the power monitor detector 27 are stacked one on top of the other with a filter 28 placed in front of the filter detector 26. A collimated beam 29 strikes both of the detectors, 26 and 27 with the lower portion of the beam 29 first passing through the filter 28 prior to striking the filter detector 26. Unfortunately, in this configuration the center portion of the collimated beam 29 where the power of the beam is the highest is not used. Thus, this configuration is not as sensitive to detect small changes in the beam as is desired.

Since optoelectronics packaging is one of the most difficult and costly operations in the manufacturing process, designers are always striving for simpler more compact cost effective arrangements and solutions.

BRIEF DESCRIPTION OF THE DRAWINGS

The following is a brief description of the drawings, wherein like numerals indicate like elements throughout.

DETAILED DESCRIPTION

Figure 3:
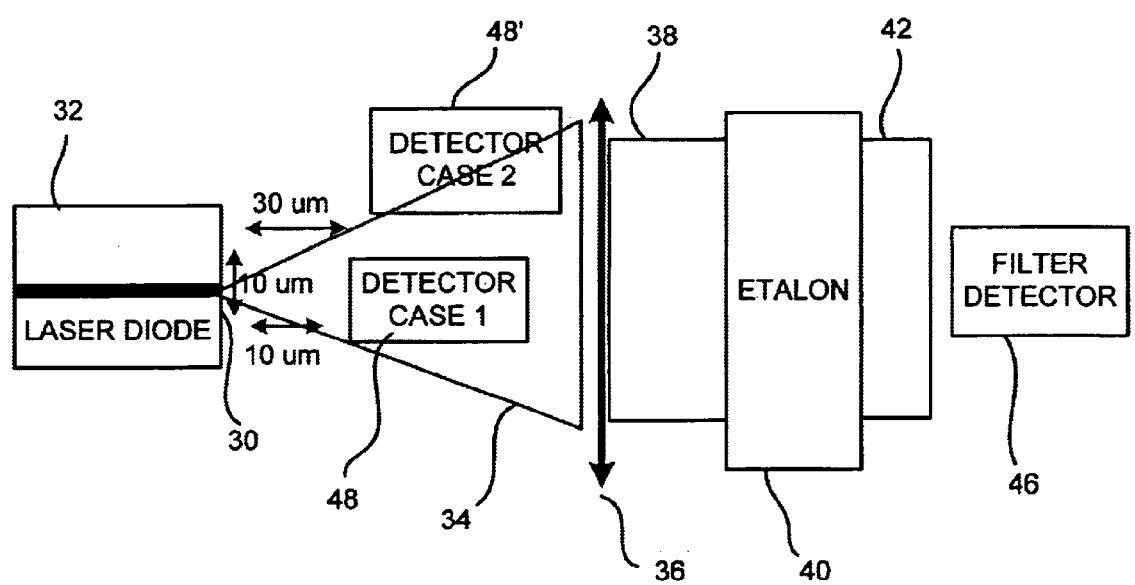
FIG. 3 is a block diagram of a wavelength locker according to one embodiment of the invention.

One embodiment of the present invention is shown in FIG. 3. Here, a back facet 30 of a laser diode 32 outputs a monitored beam 34. The monitored beam 34 passes through a lens 36 to produce a collimated beam 38. The collimated beam 38 passes through a filter (etalon) 40 and thereafter the now collimated, filtered beam 42 falls on a filter detector 46 which outputs a signal indicating the power of the beam 34 as well as the wavelength of the beam being output by the laser diode 32.

Figure 1A:
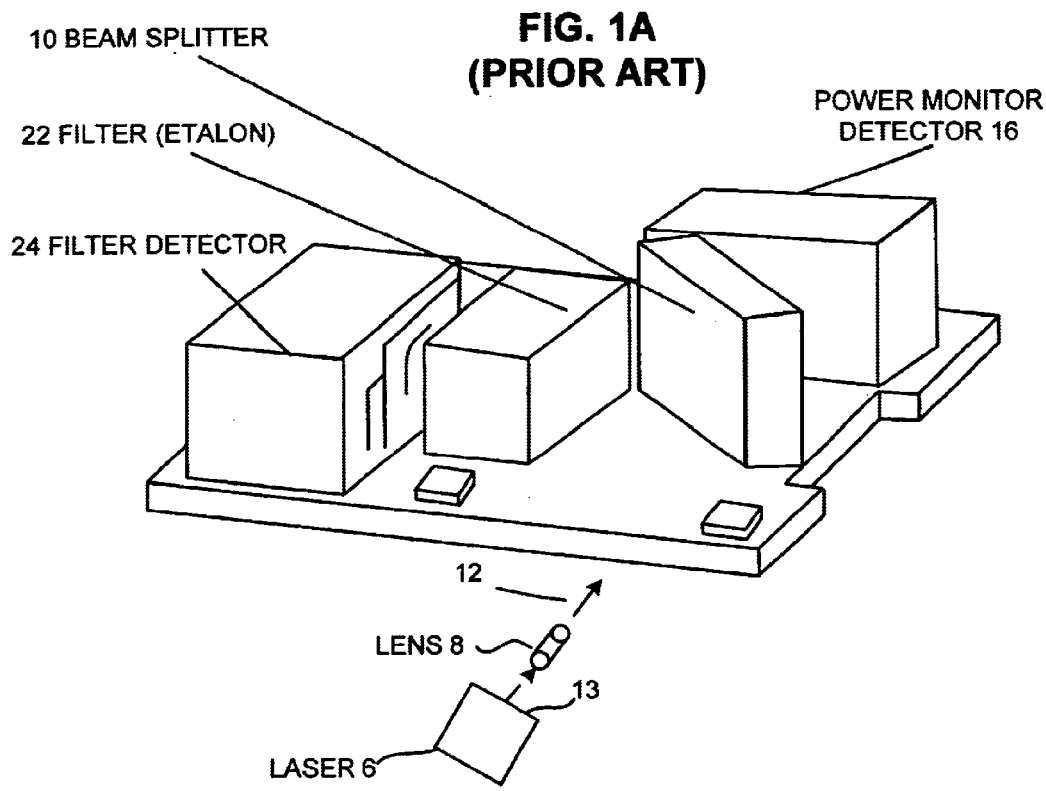
FIG. 1A is a plan view of conventional configuration for a wavelength locker.
Figure 1B:
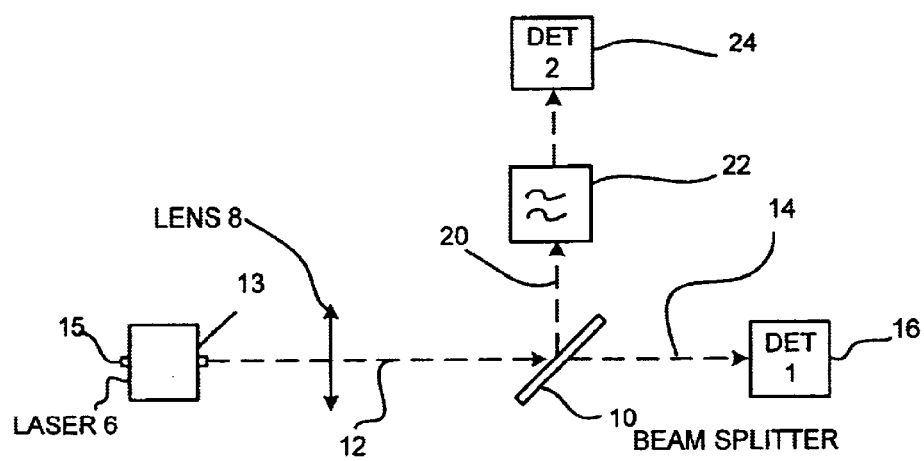
FIG. 1B is a block diagram of the wavelength locker shown in FIG. 1A.
Figure 2:
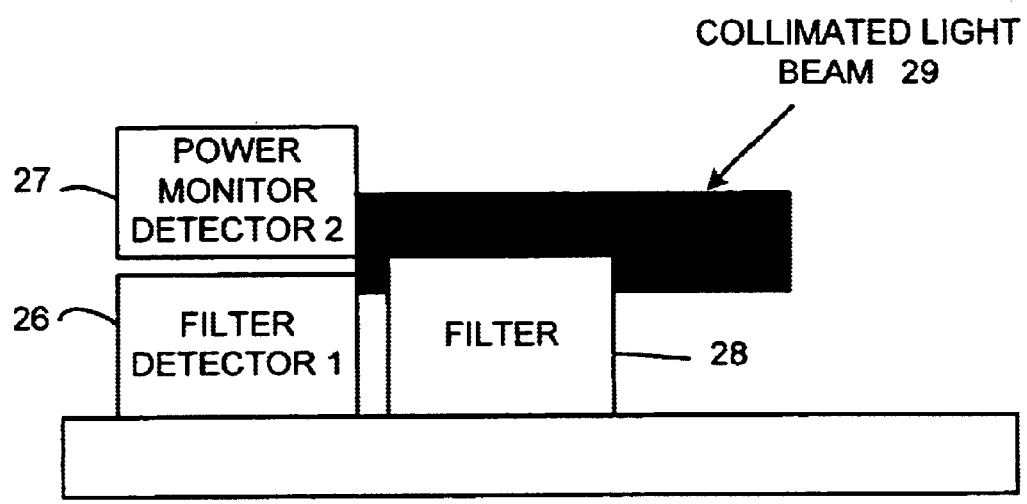
FIG. 2 is a block diagram of a conventional stacked detector wavelength locker.

Unlike the conventional examples shown in FIGS. 1A and 1B, no beam splitter is used. Instead, the second detector 48 is placed directly in the path of the monitored beam in front of the lens 36. The signals output by the detectors, 46 and 48, can be mathematically operated on to determine the wavelength of the monitored beam 34. Two cases for possible placement of the second detector are shown in FIG. 3. In the first case (case 1), the power monitor detector 48 is centered in the path of the monitored beam 34 about 10 $\mu$m behind the laser 32. In the second case (case 2) the power monitor detector 48' is placed about 30 $\mu$m behind the laser and offset to one side by about 10 $\mu$m.

Figure 4:
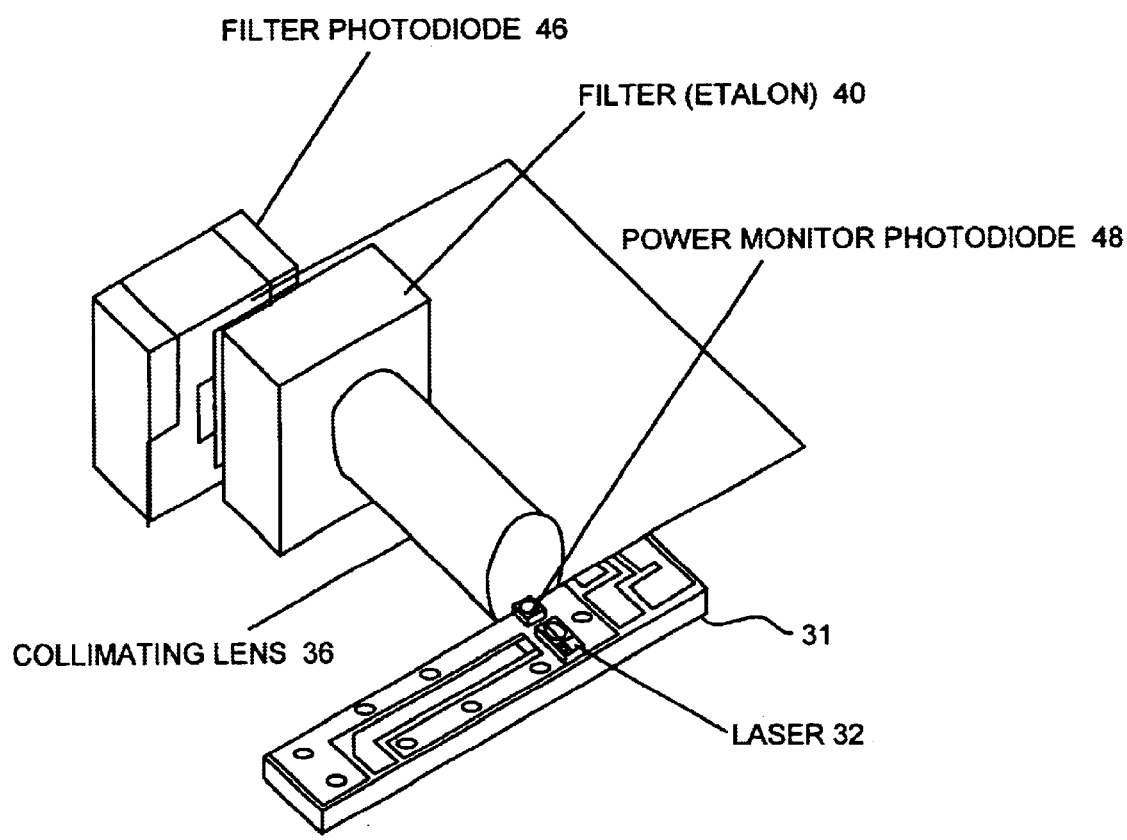
FIG. 4 is a plan view of wavelength locker according to one embodiment of the invention.

FIG. 4 shows a set up for testing the impact of a detector between the lens 36 and the laser 32 on the etalon 40 to measure the etalon response. As shown, the set up comprises a laser diode 32 mounted on a substrate 31. The power monitor detector 48 is also mounted on the substrate behind the laser diode 32. A collimating lens 32 collimates the light from the laser 32 which is then filtered by filter 40 and is detected by the filter detector 46.

Measurements were taken with the power monitor photodiode 48 placed at two different locations as discussed above. For the first measurement, the power monitor photodiode 48 was placed approximately 10 $\mu$m behind the laser diode 32. For the second measurement, the power monitor photodiode 48 was placed approximately 30 $\mu$m behind and 10 $\mu$m to the side of the laser diode 32. In both cases, sufficient light was collected by filter detector 46 for the wavelength locker to operate within acceptable specifications. For the disclosed embodiments a minimum signal strength of 20 $\mu$A output by the filter detector 36 is required for effective wavelength locking. In the first case, the light collected produced a 136 $\mu$A signal output from the filter detector 46. In the second case, a 72 $\mu$A signal was produced from the collected light by the filter detector 46. Both, well within the acceptable range.

In addition to signal strength, the extinction ratio (ER) is also a factor that needs to be considered. When positioning the power monitor detector 48 in the direct path of the monitored laser beam it blocks some of the light that would otherwise pass through the etalon 40 and reach the filter detector 46. The extinction ratio (ER) is a measure of the effectiveness of the etalon filter for wavelength locking. The extinction ratio is defined as:

ER=(Maximum filter detector current)/(minimum filter detector current). The minimum ER specification for the disclosed embodiments is 3 dB.

Figure 5:
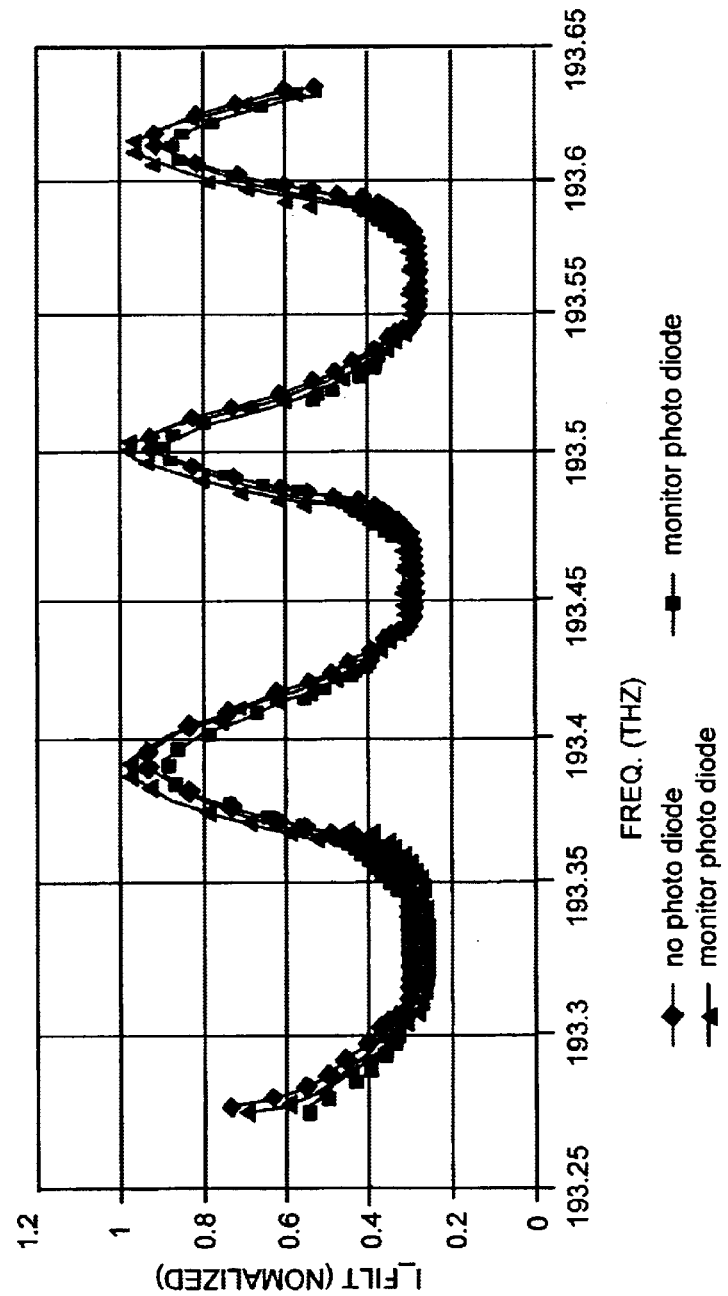
FIG. 5 is a diagram plotting the filter response for various placements of the power monitor detector.

As shown in FIG. 5, without the power monitor detector 48 partially blocking the path of the laser, the measured ER was 4.9 dB. With the detector 10 $\mu$m behind the laser, the measured ER was 4.3 dB. Finally, with the detector 30 $\mu$m behind the laser 32 and 10 $\mu$m to the side of the laser 32 a higher ER of 5.3 dB was measured. These measurements are shown in FIG. 5 which again demonstrates that a sufficient ER measurement can be obtained. In particular, it is noted that there is no appreciable change in etalon response as the power monitor detector 48 is repositioned between the etalon 40 and the laser 32.

This embodiment of the invention eliminates the need for a beam splitter as well as reduces the overall footprint of the wavelength locker saving package space. Of course, the examples offered show the power monitor detector 48 in two alternate positions; however, it is understood by those skilled in the art that the power detector 48 could be anywhere within the area of the beam 34 so long as sufficient light can be gathered by the detectors 46 and 48. For example, the power detector may be positioned 5–15 $\mu$m behind the laser 32 and 20–40 $\mu$m to the side of the laser 32.

Figure 6:
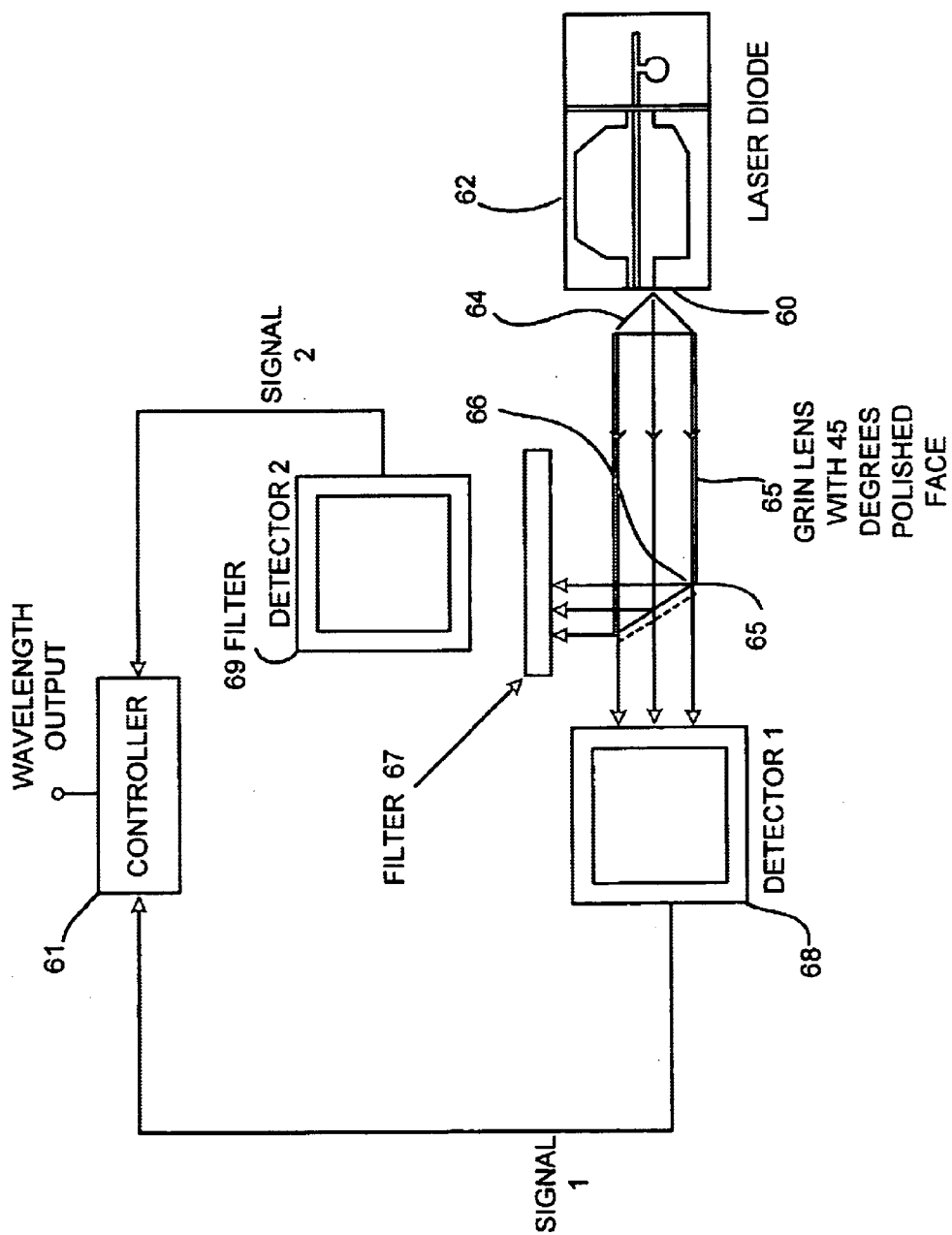
FIG. 6 is a block diagram of a wavelength locker according to another embodiment of the invention.

FIG. 6 shows another embodiment of the invention that uses a lens having an angled, polished face to split the monitored beam between the two detectors. As shown, the back facet 60 of a laser diode 62 outputs a monitored beam 64 which is collimated through a micro-gradient index (GRIN) lens 65. The end face 66 of the GRIN 65 is angled at 45 degrees and is coated with a broadband partially reflective coating. Of course other angles may be appropriate such as in a range between 30–60 degrees. The GRIN lens 65 used in this fashion permits the use of a single element as both a collimator and a splitter.

The splitting ratio can be selected by the appropriate selection of the coating material. For example, a coating may be selected to provide for 30% transmission and 70% reflection of passing light. A thin film filter 67 filters the reflected beam. The power monitor detector 68 gives a signal (signal 1) proportional to power only and the filter detector 69 gives a signal (signal 2) that is a function of wavelength and power. As before, by mathematically operating on these two signals, as with controller 61, the wavelength of the monitored beam 64 can be determined.

Alternatively, the filter 67 can be omitted and instead, a thin film filter 65 can be applied directly on the GRIN end face 66. In this case, both detectors, 67 and 68, produce a signal having a function of wavelength since filtered light reaches both detectors. In this case, the sum of the two signals can be used to monitor the power of the laser. Further, in this alternate arrangement, the difference of the two detector signals has twice the slope vs. wavelength compare the case when the filter 67 is used, effectively enhancing the wavelength locker sensitivity.

Figure 7A:
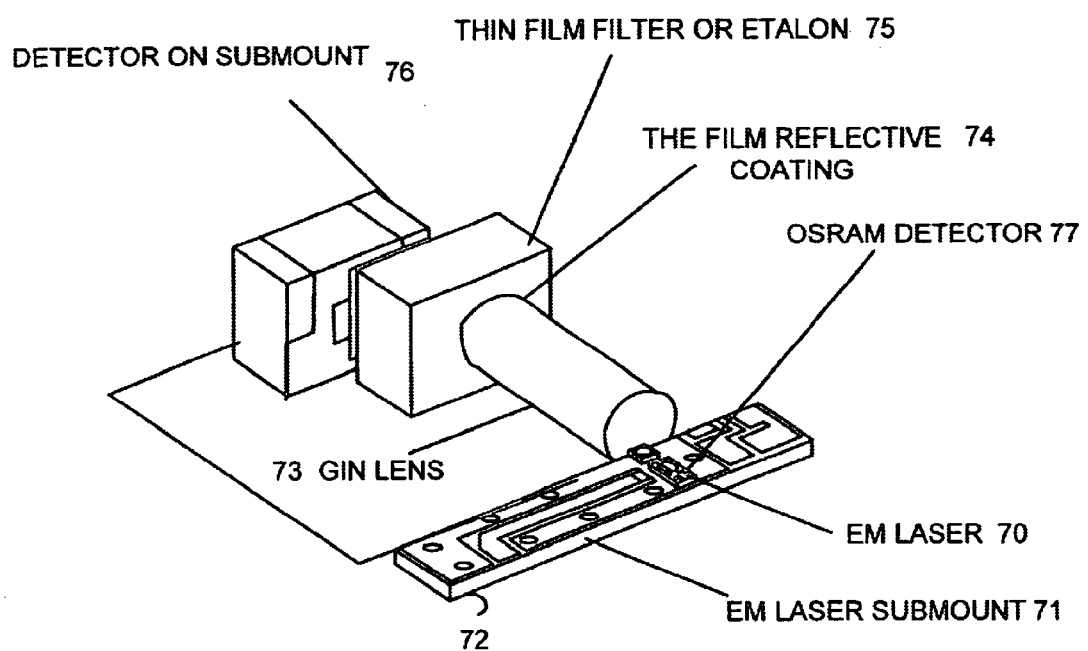
FIGS. 7A–7B show plan views of yet another embodiment of the invention using the GRIN lens as both a collimator and a beam splitter.
Figure 7B:
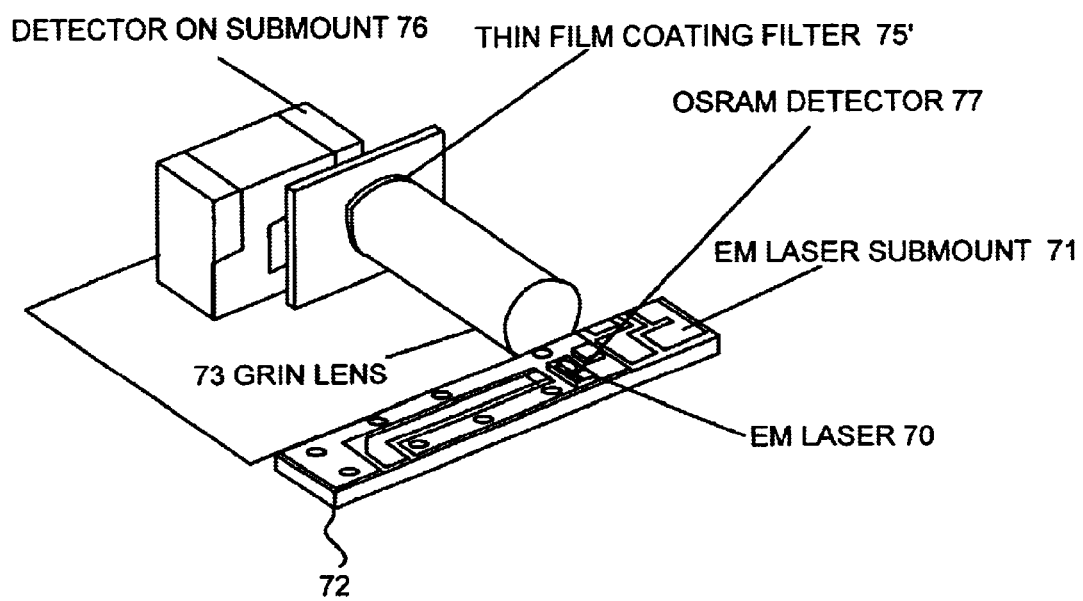

FIGS. 7A–B show yet another embodiment of the present invention similar to the embodiment shown in FIG. 4. A laser 70 is mounted on a sub-mount 71 on a substrate 72. A monitored beam from the back facet of the laser 70 is collimated with a GRIN lens 73. A thin film reflective coating filter 74 is placed on the far end of the GRIN lens 73 that allows a portion of the monitored beam to pass through. As shown in FIG. 7A the portion of the monitored beam that passes through is filtered by a filter 75 and then passes to the filter detector 76. In FIG. 7B, the filter 75 is replaced by a thin film filter 75' also coating the GRIN lens 73 However, unlike the previous embodiments, the power detector 77 is placed adjacent to the laser 70 since a second portion of the monitored light is reflected back through the GRIN lens by the thin film reflective coating 74.

Figure 8:
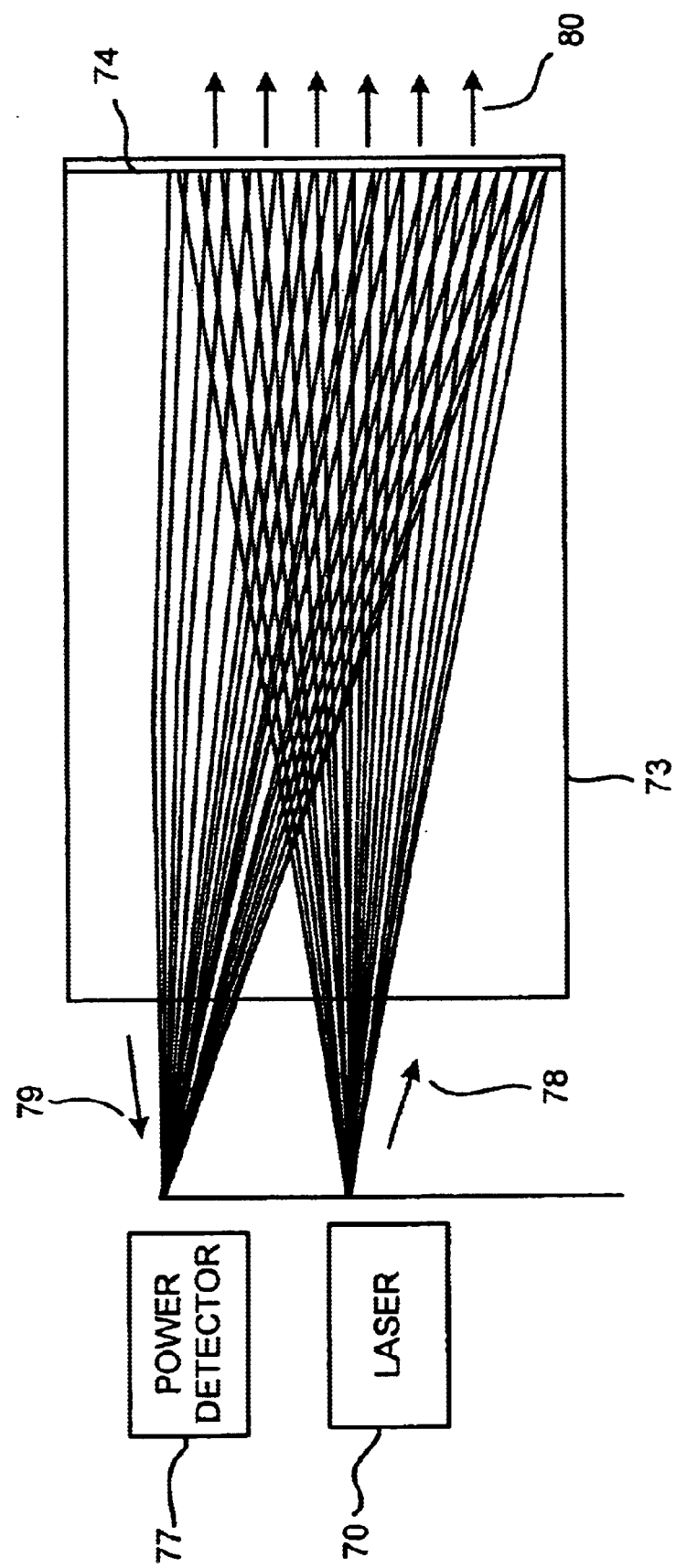
FIG. 8 is a ray tracing diagram showing the operation of the GRIN lens of FIGS. 7A–7B.

This is better shown in FIG. 8. The GRIN lens 73 collects the monitored light 78 from the laser diode 70. The GRIN lens 73 collimates the light. The partially reflective coating 74 applied on the end face of the GRIN reflects a portion of the light back 79 while allowing another portion of the light to pass 80. The light reflected back is focused on the power detector 77 located near the laser 77. In this configuration the GRIN lens 73 acts as both a lens and beam splitter. This wavelength locker can be tuned simply by moving the lens 73 in translation or rotate the assembly containing the filter 75.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A wavelength locker, comprising:
   a lens to collimate a monitored beam from a light source to produce a collimated beam;

a filter to filter the collimated beam to output a filtered beam;

a first detector to detect the filtered beam; and a second detector positioned in a path of the monitored beam between the light source and said lens.

2. The wavelength locker as recited in claim 1, wherein said first detector produces a first signal which is a function of the monitored beam power and the second detector produces a second signal which is a function of the monitored beam wavelength.

3. The wavelength locker as recited in claim 1 wherein said second detector is positioned approximately 5–15 μm in front of the light source.

4. The wavelength locker as recited in claim 1 wherein said second detector is positioned approximately 5–15 μm in front of the light source and approximately 20–40 μm to one side of the light source.

5. A method for operating a wavelength locker, comprising:

collimating a monitored beam from a source to produce a collimated beam;

filtering the collimated beam and outputting a filtered beam;

detecting the filtered beam and producing a first signal as a function of monitored beam wavelength; and detecting the monitored beam emerging from the light source prior to collimating and producing a second signal as a function of the monitored beam power.

6. A method for operating a wavelength locker are recited in claim 5, further comprising:

operating on said first signal and said second signal to determine a wavelength of the monitored beam.

7. An optical system, comprising:

a laser, having a front facet and a back facet, mounted on a substrate;

a collimating lens positioned to receive an unfiltered beam emerging from said back facet;

an etalon positioned behind said collimating lens to filter the unfiltered beam;

a first light detector positioned behind said etalon to receive the filtered beam emerging from said etalon;

a second light detector mounted on said substrate with said laser between said back facet and said collimating lens to receive the unfiltered beam emerging from said back facet; and a controller to receive a first signal from said first detector and a second signal from said second detector to determine a wavelength of a beam from said front facet of said laser.

8. The optical system as recited in claim 7 wherein said second light detector is positioned anywhere within a cone shaped path of the unfiltered beam.

9. The optical system as recited in claim 7, wherein said second light detector is positioned approximately 5–15 μm from said back facet.

10. The optical system as recited in claim 7 wherein said second light detector is positioned approximately 5–15 μm in front of said back facet and approximately 20μ40 μm to one side of said back facet.

* * * * *

UNITED STATES PATENT AND TRADEMARK OFFICE
CERTIFICATE OF CORRECTION

PATENT NO. : 6,838,658 B2
DATED : January 4, 2005
INVENTOR(S) : Colin et al.

It is certified that error appears in the above-identified patent and that said Letters Patent is hereby corrected as shown below:

Column 6,
Line 28, delete "20μ40 μm" and insert -- 20-40 μm --.

Signed and Sealed this

Fifth Day of July, 2005

JON W. DUDAS
*Director of the United States Patent and Trademark Office*